(12) United States Patent
Watatani et al.

(10) Patent No.: US 6,803,597 B2
(45) Date of Patent: Oct. 12, 2004

(54) SEMICONDUCTOR LIGHT-EMITTING DEVICE USING GRADED MULTI QUANTUM BARRIER

(75) Inventors: Chikara Watatani, Tokyo (JP); Yoshihiko Hanamaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 119 days.

(21) Appl. No.: 10/322,675

(22) Filed: Dec. 19, 2002

(65) Prior Publication Data

US 2003/0197188 A1 Oct. 23, 2003

(30) Foreign Application Priority Data

Apr. 23, 2002 (JP) ........................................ 2002-121128

(51) Int. Cl.⁷ .............................................. H01L 29/15
(52) U.S. Cl. ............................ 257/15; 257/13; 257/14; 257/17
(58) Field of Search .............................. 257/13, 14, 15, 257/17

(56) References Cited

U.S. PATENT DOCUMENTS 6,175,123 B1 * 1/2001 Kano ........................... 257/13
6,430,204 B1   8/2002 Tanaka

FOREIGN PATENT DOCUMENTS

| JP | 9-8342 | 1/1997 |
| JP | 10-27925 | 1/1998 |
| JP | 2000-133879 | 5/2000 |

OTHER PUBLICATIONS

Pan, Jen–Wei et al., "Suppression of electron and hole leakage in 1.3μm AlGaInAs/InP quantum well lasers using multiquantum barrier" Applied Physics Letters, vol. 72, No., 17, Apr. 27, 1998, pp. 20902092.

Fukushima, T. et al., "Carrier confinement by multiple quantum barriers in 1.55μm strained GaInAs/AlGaInAs quantum well lasers", Applied Physics Letters, 66 (16), Apr. 17, 1995, pp. 20252027.

* cited by examiner

*Primary Examiner*—Gene M. Munson
(74) *Attorney, Agent, or Firm*—Leydig, Voit & Mayer, Ltd.

(57) ABSTRACT

In a semiconductor light-emitting device, an active layer has a multi quantum well structure (MQW) barrier layers and quantum well layers alternately arranged. Each of the cladding layers has a multi quantum barrier structure (MQB) including barrier layers and well layers alternately arranged. The multi quantum barrier (MQB) of each of the cladding layers varies in a graded or stepwise form. Thus, charge carriers are prevented from overflowing from the active layer, preventing cut-off of a guided wave mode, increasing reflectance of electrons entering the energy barriers, and improving temperature characteristics.

6 Claims, 11 Drawing Sheets

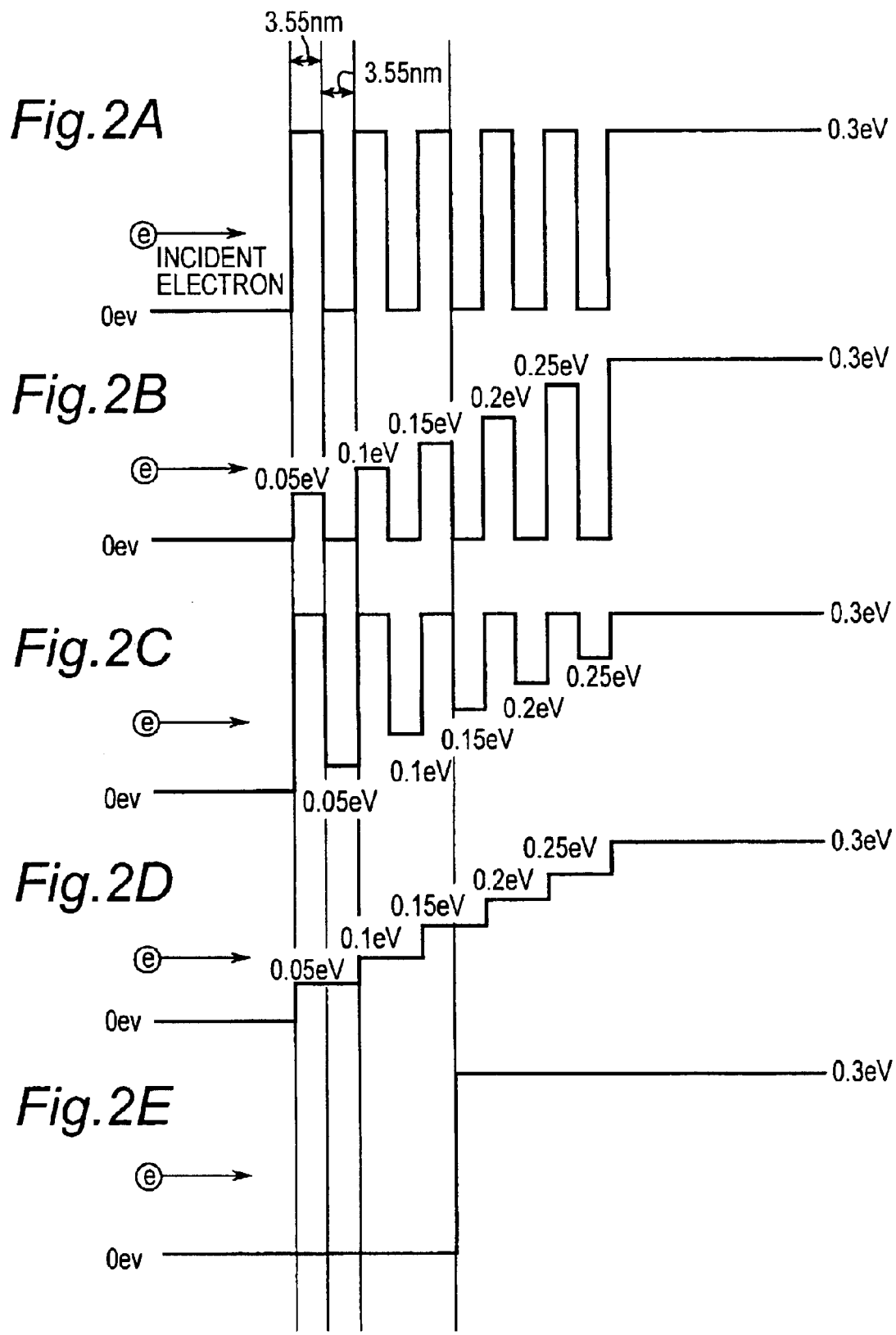

i: NON-DOPED
p: p-TYPE DOPED

ⓔ : ELECTRON
ⓗ : HOLE

SEMICONDUCTOR LIGHT-EMITTING DEVICE USING GRADED MULTI QUANTUM BARRIER

BACKGROUND OF THE INVENTION

1. Field of the Invention

The present invention generally relates to a semiconductor light-emitting device, and in particular, to a semiconductor light-emitting device such as a semiconductor laser for optical communication requiring high temperature and high speed operation with a sloped or graded multi quantum barrier structure to suppress overflow of carriers from an active layer to improve temperature characteristics.

2. Description of the Prior Art

Recently, in order to effectively deal with high speed data communication, it has been necessary to utilize optical communication networks using optical fibers. The optical communication network must be extended to a subscriber's network as well as to a trunk line network.

A semiconductor light-emitting device such as a semiconductor laser is used as a key device for the optical communication network. As a semiconductor laser therefor, it is required to use a semiconductor light-emitting device which can operate at a high speed and high temperature without requiring an additional device, such as a cooling device or the like, in views of handling a large amount of data, low cost, and high reliability.

In a high speed modulation operation, heat generation of a semiconductor light-emitting device itself causes a rise in temperature. Electrons (i.e., carriers) have thermal energy because of such increase in temperature. For this reason, the electrons easily overflow from an active layer serving as a light emitting area of the semiconductor light-emitting device over an energy barrier, which results in a quantum efficiency decrease. The quantum efficiency herein refers to a ratio of radiative energy converted from an energy input and energy absorbed in a light-emitting device in a light emission process.

In order to emit light efficiently in a semiconductor laser, it is important to optimize confinement of carriers and light within the semiconductor. Therefore, a heterostructure is frequently used in which semiconductor active layer is sandwiched between paired semiconductor cladding layers, each having larger band gap energy and smaller refractive index than the active layer. In this heterostructuer, the carrier confinement and light confinement are efficiently performed.

A compound semiconductor is generally used as a semiconductor material for obtaining direct transition of radiative energy. For example, GaN, GaAs, GaAlAs, InGaAsP, InGaAs, GaSb and AlGaSb are selectively used in accordance with a light emission wavelength. A structure of an active layer is usually constructed as a quantum well structure.

Hereinafter, a basic structure and an operation of a conventional semiconductor laser will be described with reference to FIGS. 8 and 9. FIG. 8 is a schematic perspective view showing an example of the basic structure of the conventional semiconductor laser. FIG. 9 is a model view for explaining an energy band gap of the basic semiconductor laser.

As shown in FIG. 8, in a basic structure of a semiconductor laser 80, an active layer 81 for generating light is sandwiched between cladding layers 82a and 82b for confining the light. The active layer 81 generally has a multi quantum well structure (which hereinafter will be simply referred to as "MQW"). The MQW is formed in a manner such that, a barrier layer 83 made of a material having a large energy band gap and a thin quantum well layer 84 (also referred to as "well layer") made of a material having a small energy band gap are alternately sandwiched to form a quantum well structure, and a plurality of pairs of the quantum well structures are held between the cladding layers.

The quantum well structure is an artificial structure which confines carriers in one direction where the carriers serve as free electrons. The semiconductor laser described here is explained by taking a quantum well laser as an example in which the electrons and holes are confined within a narrow quantum well layer to efficiently generate laser oscillation.

Referring to FIG. 8, each of the barrier layers 83 has a thickness of, e.g., about 10 to 20 nm, and each of the quantum well layers 84 has a thickness of, e.g., about 5 to 10 nm. Carriers such as electrons e and holes h are confined within an area (quantum well layer, i.e., well layer) having a small energy band gap, and the light is confined within an area having a large refractive index. The energy band gap has a correlation with the refractive index. A material with a smaller energy band gap has a larger refractive index. Accordingly, in a typical model example shown in FIG. 9, the carriers (e, h) and the light are both distributed mainly around the center area of the active layer.

Next, a separated confinement heterostructure (which hereinafter is simply referred to as "SCH") will be described with reference to FIG. 10. In FIG. 8, if the active layer 81 having a MQW structure is made thin, quantum efficiency and high speed operational characteristic are improved, but a cut-off of a guided mode occurs to be problematic. In order to solve such a problem, variation is made in refractive index distributions of an n-cladding layer and a p-cladding layer provided outside the active layer. Thus, light generated at the active layer is leaked, so that the cut-off is prevented by the SCH in which the area for confining carriers (electrons e and holes h) is separated from the area for confining the light.

Specifically, it is noted that a structure having a continuously varying refractive index distribution of the cladding layer is referred to as GRIN (Graded Refractive Index), and a structure having a stepwise varying refractive index distribution is referred to as STEP. FIG. 10 is a model view showing an energy band gap of a semiconductor laser having cladding layers with STEP structure.

In a manufacturing procedure for a semiconductor laser, zinc (Zn), magnesium (Mg), beryllium (Be), carbon (C) and the like are used as materials for p-type doping.

In accordance with the above-described STEP heterostructure shown in FIG. 10, although the cut-off of the guided mode is improved, the energy band gap is formed in correlation with the refractive index of the cladding layer which is varied stepwise. For this reason, there is a problem that the carriers easily overflow from the active layer.

Moreover, zinc (Zn) serving as a p-type dopant has large thermal diffusion. The active layer becomes p-type by the zinc (Zn) diffusing to the active layer which should be originally a non-doped area. Thus, zinc (Zn) cannot be used for doping in the vicinity of the active layer. Further, there arise a problem in that other dopants with less thermal diffusion produce a low density of carriers, and are difficult to be introduce in a manufacturing process of the semiconductor material.

The present inventors devised a structure of a multi quantum barrier (hereinafter simply referred to as "MQB")

which is provided for the cladding layer in order to prevent carriers from overflowing from the active layer. FIG. 11 shows a model of the energy band gap of the semiconductor laser which uses the MQB structure for the cladding layers. In the structure shown in FIG. 11, periodic barriers of MQB are provided for the n-cladding layer 82a and the p-cladding layer 82b and the active layer having a MQW structure is sandwiched between the n-cladding layer 82a and the p-cladding layer 82b, so that an energy barrier of each cladding layer is made high because of quantum effects. Thus, it is possible to effectively prevent the carriers from overflowing from the active layer.

In accordance with the semiconductor laser adopting the MQB structure for such cladding layers as shown in FIG. 11, however, there arises a cut-off problem of a guided mode.

SUMMARY OF THE INVENTION

The present invention has been made in order to solve the above-described problems, and an object of the present invention is to suppress overflowing of carriers from an active layer serving as a multi quantum well (MQW) layer by utilizing a MQB for STEP structure of cladding layer, to prevent cut-off of a guided mode, to increase a reflectance of electrons entering energy barriers and to improve a temperature characteristic of a semiconductor laser.

In order to accomplish the aforementioned object, a semiconductor light-emitting device of the present invention includes an active layer for generating a light and a pair of cladding layers. The active layer has a multi quantum well structure in which a plurality of barrier layers and a plurality of quantum well layers are alternately arranged. The paired cladding layers sandwiches the active layer to confine the light within the active layer. Each of the cladding layers has a multi quantum barrier structure in which a plurality of barrier layers and a plurality of well layers are alternately arranged, and the multi quantum barrier layers of each of the cladding layers are graded or stepwise in configuration.

As the graded or stepwise MQB structure is provided for the cladding layers sandwiching the active layer, cut-off of a guided mode can be prevented, a reflectance of electrons entering the energy barriers can be increased and a temperature characteristic of a semiconductor light-emitting device can be improved.

BRIEF DESCRIPTION OF THE DRAWINGS

These and other objects and features of the present invention will be readily understood from the following detailed description taken in conjunction with preferred embodiments thereof with reference to the accompanying drawings, in which:.

FIGS. 2A through 2E are views showing calculation models for comparing energy barriers against electrons in a conduction band overflowing from an active layer to a cladding layer;

DESCRIPTION OF THE PREFERRED EMBODIMENTS

Figure 1:
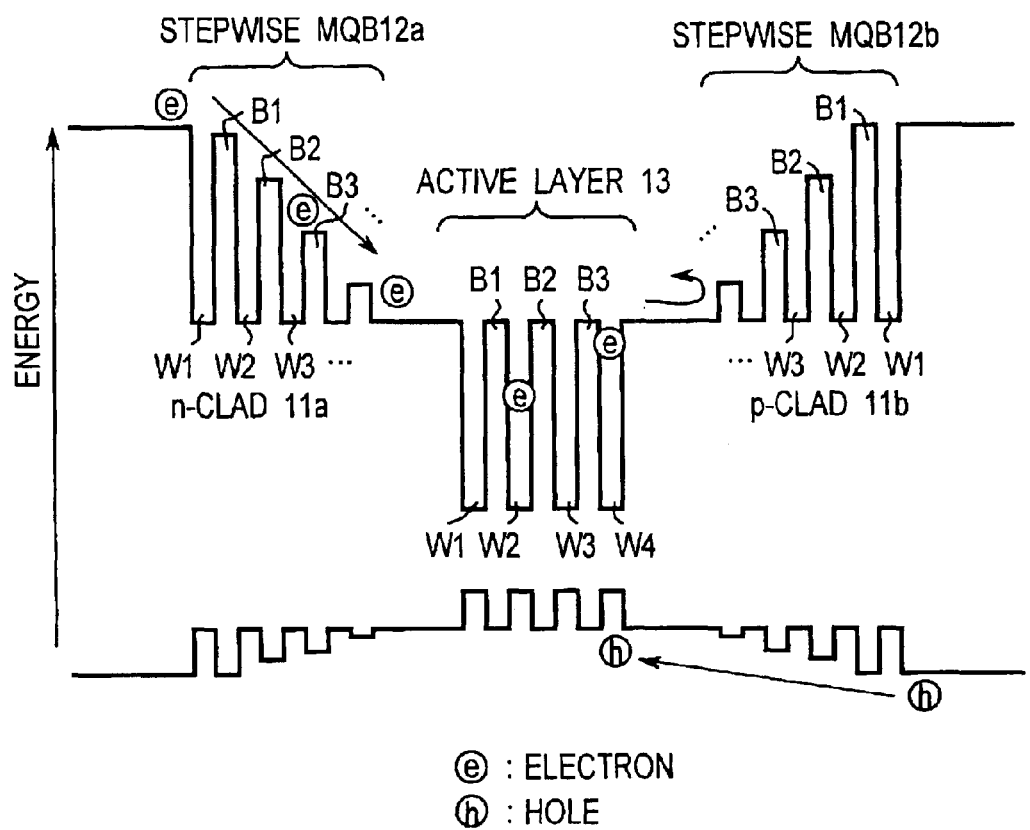
FIG. 1 is a view for explaining an energy band gap of an MQB according to a first embodiment of the present invention.

Hereinafter, preferred embodiments of the present invention will be described with reference to FIGS. 1 through 7. The common elements in the respective figures are denoted by the same reference numerals, and repetitive details will be omitted for brevity.

[First Embodiment]

A first embodiment of the present invention will be described hereinafter with reference to FIG. 1 in the case where a semiconductor laser is used as an example. FIG. 1 is a model view for explaining an energy band gap of a semiconductor laser provided with cladding layers each having a stepwise graded or sloped type multi quantum barrier (MQB) according to the first embodiment. This model shows the energy band gap in which paired MQBs 12a and 12b are symmetrically provided for the n-cladding layer 11a and p-cladding layer 11b, respectively. In the structures of the MQBs 12a and 12b, heights of barrier layers are varied stepwise. The structures of the MQB 12a and 12b for the cladding layers 11a and 11b are similar to that of a MQW serving as an active-layer 13 except that the MQB is formed in a stepped or graded type.

Specifically, in the multi quantum barrier (MQB) structure, barrier layers B1, B2, B3, . . . made of materials having a large energy band gap and thin film quantum well layers (well layers) W1, W2, W3, . . . made of materials having a small energy band gap are alternately formed in several pairs. The heights of the barrier layers B1, B2, B3, . . . are varied so as to be reduced stepwise in this order from the outer cladding layer to the inner cladding layer toward a central portion of the active layer. Electrons e flow from an n-electrode via the n-cladding layer 11a into the active layer 13 and recombine with (positive) holes h, so that light is emitted.

Figure 10:
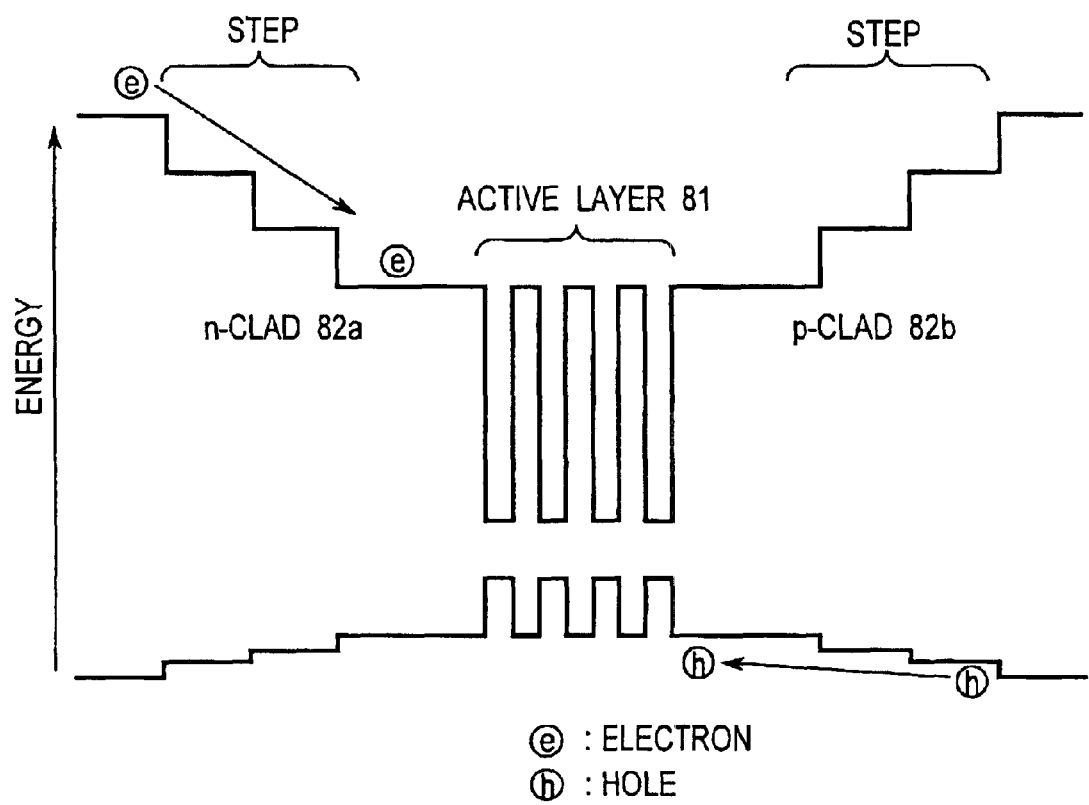
FIG. 10 is a view showing an energy band gap of a semiconductor laser having cladding layers with a conventional STEP structure.

An operation of the first embodiment will be described below. When electrons have thermal energy because of an increase in temperature of the light-emitting device, the electrons tend to overflow from the active layer 13 to the p-cladding layer 11b. The effective energy band gap of the p-cladding layer 11b is larger than that of the conventional STEP cladding structure as shown in FIG. 10 because of quantum effects of the MQB 12b. As large band gap is formed as described above, it is possible to prevent the carriers from overflowing from the active layer to the p-cladding layer. Thus, the temperature characteristic of the semiconductor laser is improved.

Figure 9:
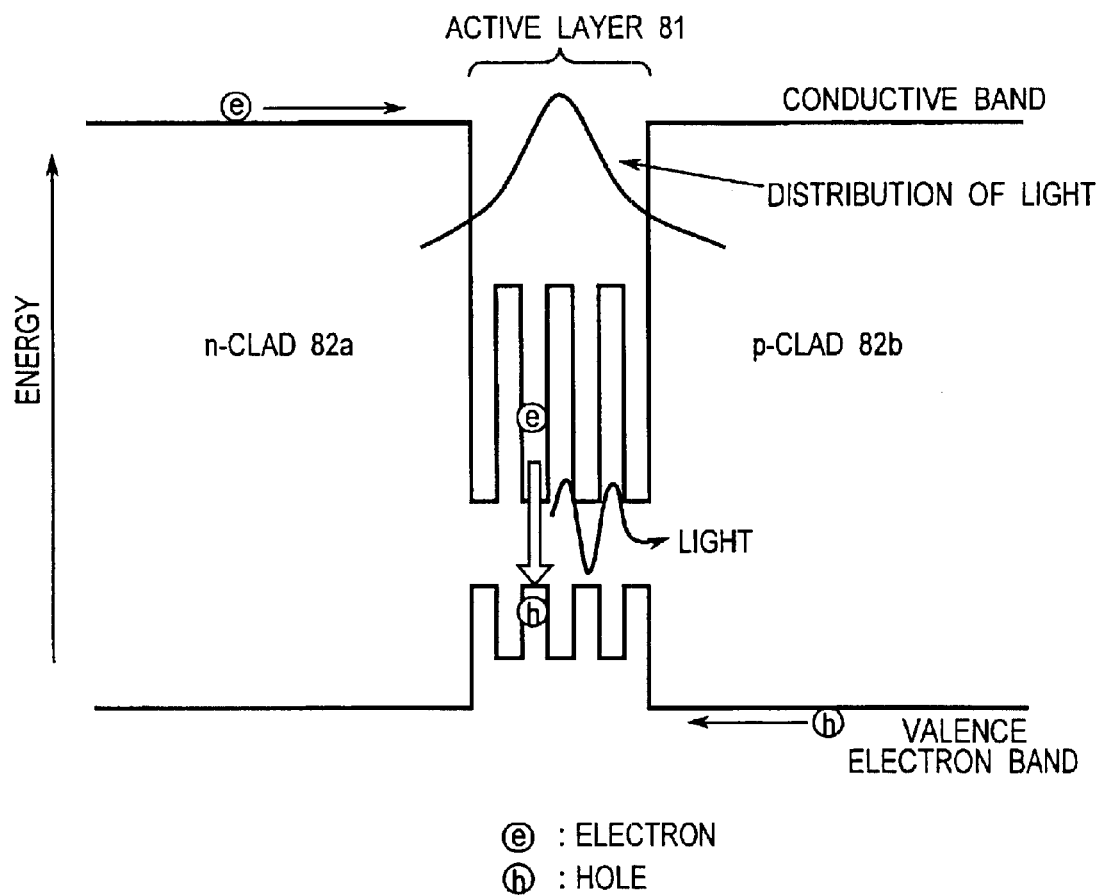
FIG. 9 is a view for explaining an energy band gap of a conventional semiconductor laser.
Figure 11:
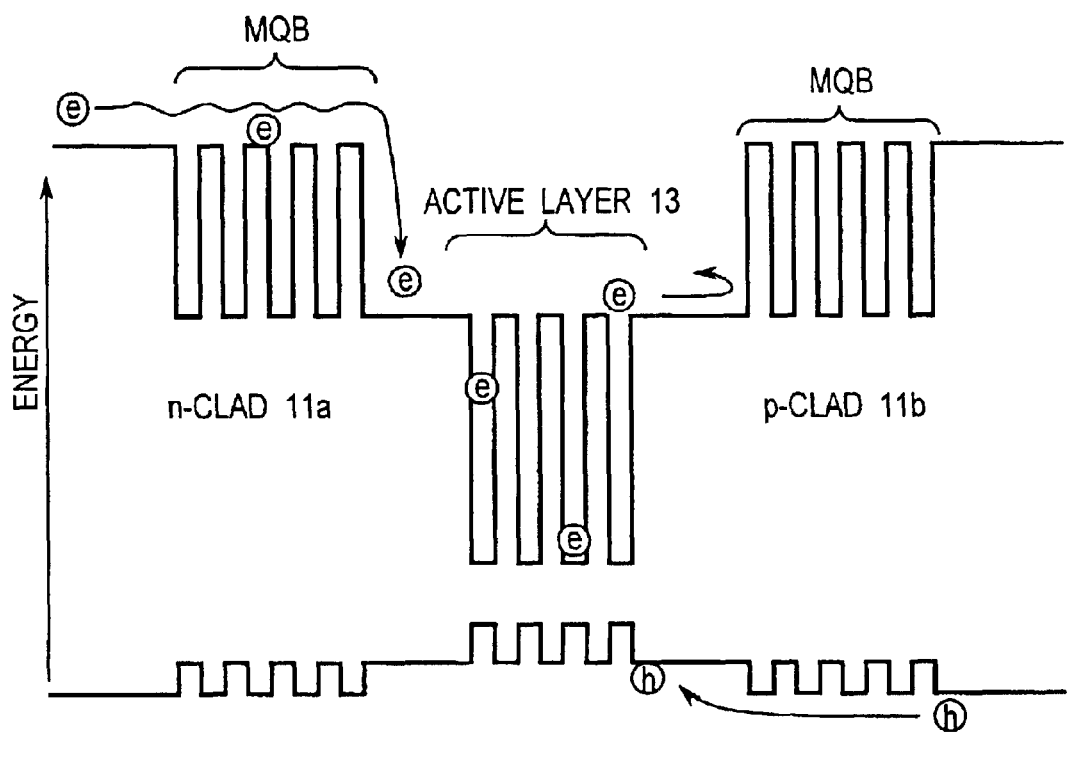
FIG. 11 is a view of a energy band gap of a semiconductor laser in which an MQB structure is utilized for cladding layers.

FIGS. 2A through 2E show calculation models for comparing energy barrier levels against the electrons in a conduction band overflowing from the active layer to the cladding layer. FIG. 2A shows a case of a MQB cladding layer having barriers of the same height as shown in FIG. 11. FIG. 2B shows a case of a MQB cladding layer in which the heights of the barriers are varied stepwise as in the first embodiment. FIG. 2C shows a case of a MQB cladding layer in which depths of the well layers are varied stepwise as in a second embodiment to be described later. FIG. 2D shows a case of the conventional STEP type cladding layer shown in FIG. 10. FIG. 2E shows a case of the conventional simple barrier cladding layer as shown in FIG. 9.

FIGS. 3A through 3E are graphs showing reflectances of electrons entering the energy barriers in the structures shown in FIGS. 2A through 2E, respectively. In FIGS. 3A through 3E, an area surrounded by a broken line indicates a remarkable area where the temperature characteristic is remarkably affected.

In the structure of the first embodiment shown in FIG. 1, the MQB cladding layer is formed to have the barrier layers which are varied in height in a stepwise graded manner as shown in FIG. 2B. More specifically, the barrier layers are varied stepwise from 0 eV to 0.05 eV, 0.1 eV, 0.15 eV, 0.2 eV, 0.25 eV and 0.3 eV, and the corresponding reflectance of the electrons e entering the cladding layer is shown in FIG. 3B.

Figure 3A:
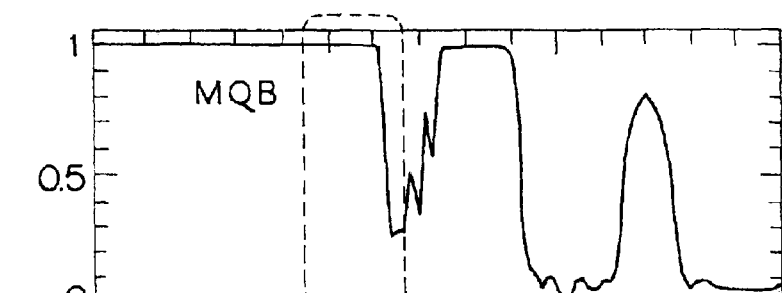
FIGS. 3A through 3E are graphs showing a reflectance of electrons entering the energy barriers in structures shown in FIGS. 2A through 2E.
Figure 3B:
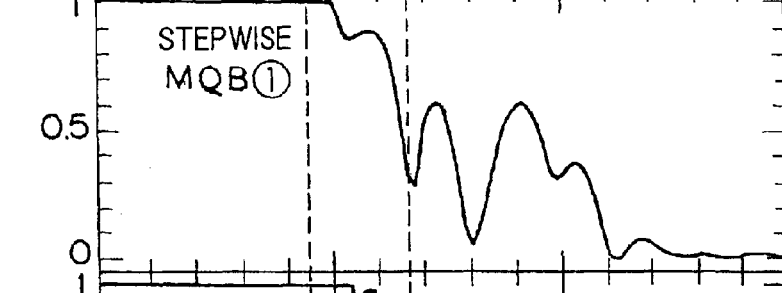
Figure 3C:
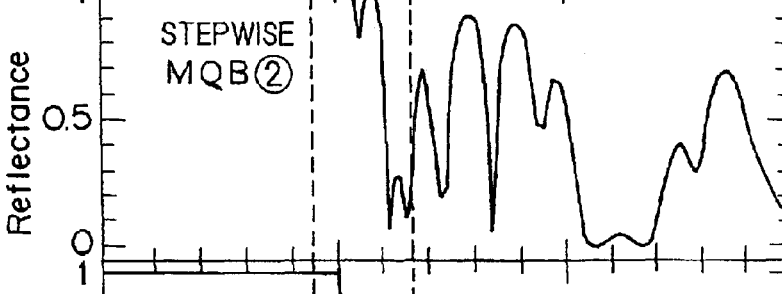
Figure 3D:
Figure 3E:
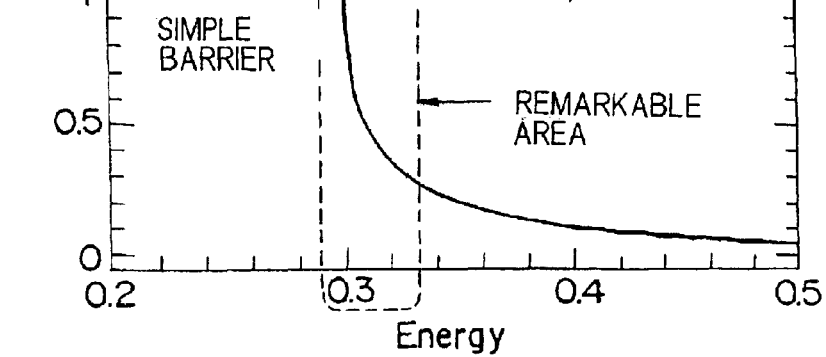

Comparing the reflectance of an area to an extent having higher energy by several tens meV than the energy band gap of the cladding layer (0.3 eV) and which is important to improve the temperature characteristic, the reflectance of FIG. 3B corresponding to the structure of FIG. 2B is larger than that of FIG. 3D corresponding to the conventional STEP structure of FIG. 2B. It is found that overflow of electrons is more effectively suppressed in the present embodiment as compared to the conventional case and the temperature characteristic of the semiconductor laser is improved.

[Second Embodiment]

Figure 4:
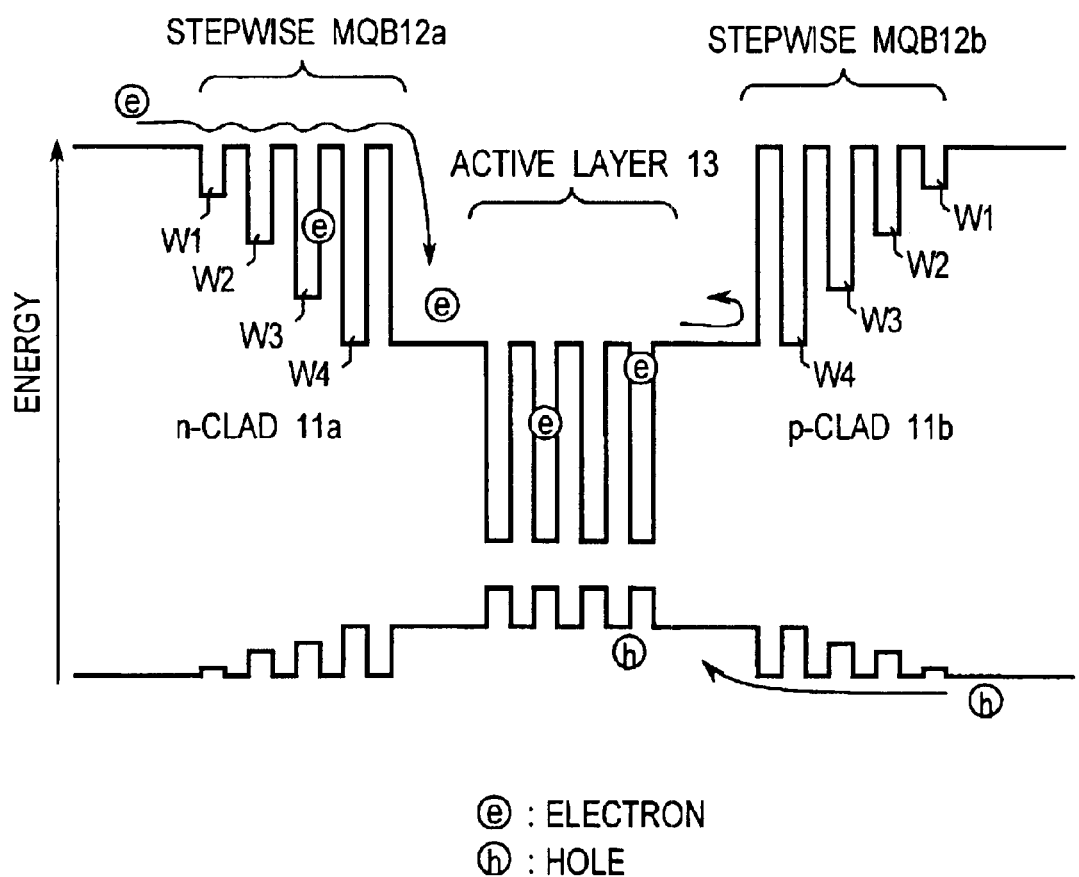
FIG. 4 is a view for explaining an energy band gap of an MQB according to a second embodiment of the present invention.

A second embodiment of the present invention will be described below with reference to FIG. 4. FIG. 4 is a model view for explaining an energy band gap of the semiconductor laser provided with the cladding layers each having a stepwise graded MQB according to the second embodiment. The second embodiment has substantially the same structure as the first embodiment but is different from the first embodiment in the point that, in the second embodiment, the n-cladding layer 11a and the p-cladding layer 11b are respectively provided with the MQB 12a and 12b in which depths of well layers are varied stepwise. As in the first embodiment, the MQBs provided for the cladding layers 11a and 11b are graded stepwise.

Specifically, in the multi quantum barrier (MQB) structure, the depths of the quantum well layers (well layers) W1, W2, W3, . . . are varied so as to be deeper stepwise in this order toward the active layer side. In this structure, electrons e flow from an n-electrode to the active layer 13 via the n-cladding layer 11a, and recombine with holes h to thereby emit light.

An operation of the second embodiment will be described below. The electrons having thermal energy due to an increase in temperature of the light-emitting device tend to overflow from the active layer 13 to the p-cladding layer 11b. As in the first embodiment, in the effective energy band gap of the p-cladding layer 11b, the carriers are suppressed from overflowing from the active layer to the p-cladding layer because of the quantum effects of the MQB. Thus, the temperature characteristic of the semiconductor laser is improved.

In the second embodiment, the explanation is made when considering a case of a MQB cladding layer model with stepwise graded well layers shown in FIG. 2C. More specifically, in the case where the well layers are varied stepwise in depth from 0 eV to 0.05 eV, 0.1 eV, 0.15 eV, 0.2 eV, 0.25 eV and 0.3 eV, the reflectance of the electrons e entering the cladding layer is shown in FIG. 3C.

With respect to the reflectance of an area to an extent which has higher energy by several tens meV than the energy band gap (0.3 eV) of the cladding layer and which is important for improving the temperature characteristic, the reflectance shown in FIG. 3C corresponding to the structure of FIG. 2C is larger than that of FIG. 3B corresponding to a model of the first embodiment shown in FIG. 2B. It is found that overflowing of the carriers is more suppressed, and the temperature characteristic of the semiconductor laser is even further improved in the present embodiment.

[Third Embodiment]

Figure 5:
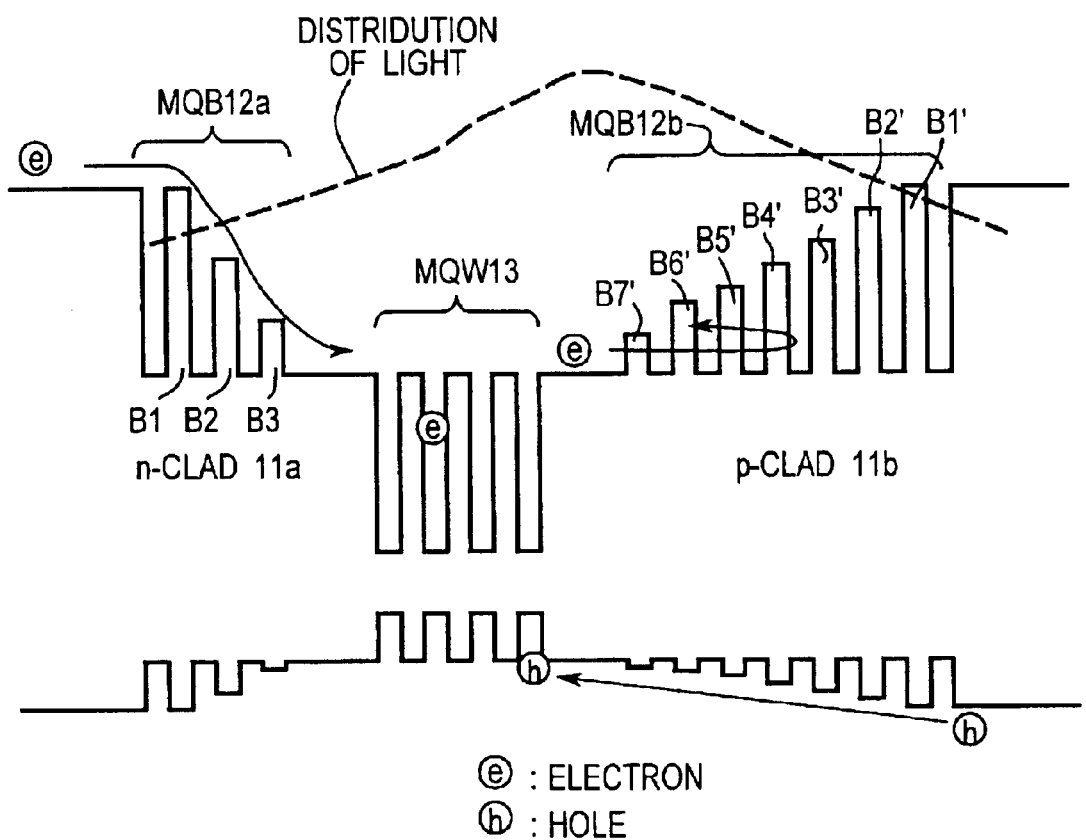
FIG. 5 is a view for explaining an energy band gap of an MQB according to a third embodiment of the present invention.

A third embodiment of the present invention will be described below with reference to FIG. 5. FIG. 5 is a model view for explaining an energy band gap of a semiconductor laser provided with cladding layers each having a stepwise graded MQB according to the third embodiment. The third embodiment has substantially the same structure as the first embodiment but is different from the first embodiment in the point that, in the third embodiment, asymmetric stepwise type MQBs (12a, 12b) with different structures to each other are respectively provided for the n-cladding layer 11a and the p-cladding layer 11b. The different structure in MQB means that a configuration and barriers of the n-cladding layer 11a are different from those of the p-cladding layer 11b.

In accordance with the third embodiment, as shown in FIG. 5, for example, the MQB structure for the n-cladding layer 11a has three barrier layers B1, B2 and B3 and the MQB structure for the p-cladding layer 11b has seven barrier layers B1' through B7'.

In the structure of the third embodiment, a refractive index of the p-cladding layer 11b is varied more gently than that of the n-cladding layer 11a. Thus, as shown by a broken line in FIG. 5, the distribution of light deviates toward the p-cladding layer 11b side. Light is amplified by providing a diffraction grating (not shown) at the p-cladding layer or the n-cladding layer in a distributed-feedback (DFB) laser. Thus, as the distribution of light can be appropriately adjusted as in the present embodiment, it becomes effective means for improving quantum efficiency.

The feature of the asymmetric stepwise MQB with different structures respectively provided for the n-cladding layer and the p-cladding layer as described in the third embodiment may be also applied to the MQB structure of the second embodiment having the well layers varied stepwise in depth as shown in FIG. 4.

[Fourth Embodiment]

Figure 6A:
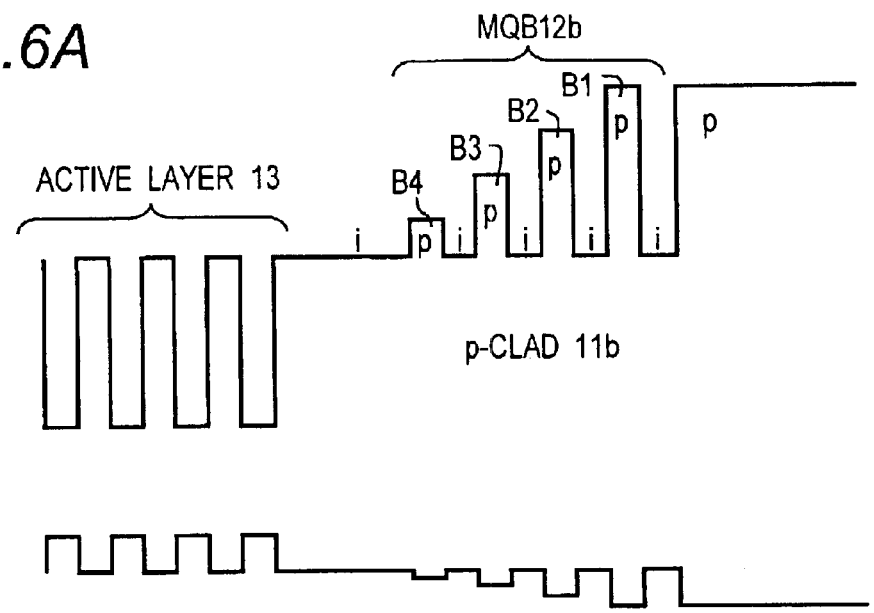
FIG. 6A is a view of an energy band gap of an MQB according to a fourth embodiment of the present invention.
Figure 6B:
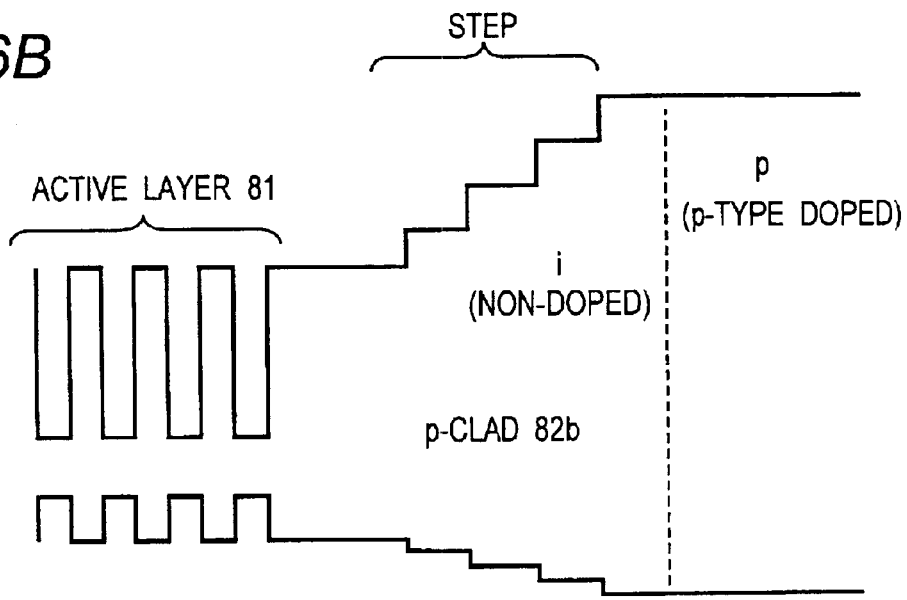
FIG. 6B is a view of a conventional energy band gap in the case where a STEP is non-doped.

A fourth embodiment of the present invention will be described below with reference to FIGS. 6A and 6B. FIG. 6A shows a model view of an energy band gap of a MQB according to the fourth embodiment. FIG. 6B shows a model view of the conventional energy band gap as a comparative example of a STEP type which is not doped as shown in FIG. 10.

As shown in FIG. 6A, in the fourth embodiment, only the barrier layers of MQB are doped. Namely, doping is performed only for the barrier layers B1, B2, B3, ... provided for the p-cladding layer 11b by using zinc (Zn) as a dopant. Well layers (quantum well layers) of the MQB 12b are not doped (doped state and non-doped state are respectively indicated by "p" and "i" in the figure).

In accordance with the fourth embodiment, only the barrier layers of the MQB are doped, and the non-doped well layers are utilized as pools for zinc (Zn). Thus, comparing to the conventional structure having a STEP of non-doped as shown in FIG. 6B, diffusion of zinc (Zn) to the active layer 13 can be effectively suppressed. Accordingly, unlike conventional cases, zinc (Zn) can be doped in the vicinity of the active layer and a reflectance of electrons entering the energy barriers is increased. Consequently, the temperature characteristic is improved.

In accordance with the fourth embodiment, partial doping (p) of the multi quantum barrier (MQB) formed in the cladding layer is performed only for the barrier layers. It is noted here that a modulation doping may be performed in a manner such that the partial doping is performed only for the well layers, a part of the barrier layers or a part of the well layers, which can obtain the same effects.

The partial doping of the multi quantum barrier (MQB) in the cladding layer described in the fourth embodiment may be appropriately combined and applied as the MQB of the above-described first to third embodiments.

[Fifth Embodiment]

Figure 7:
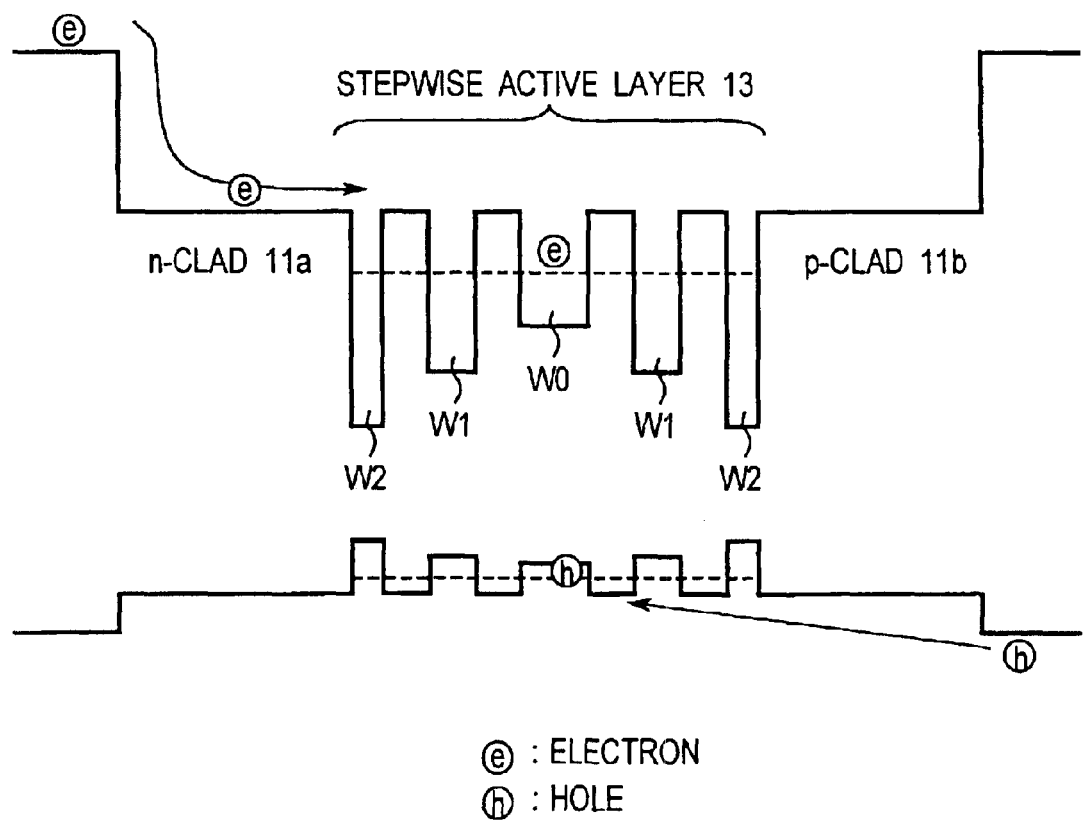
FIG. 7 is a model view of an energy band gap of a stepwise-graded MQW according to a fifth embodiment of the present invention.
Figure 8:
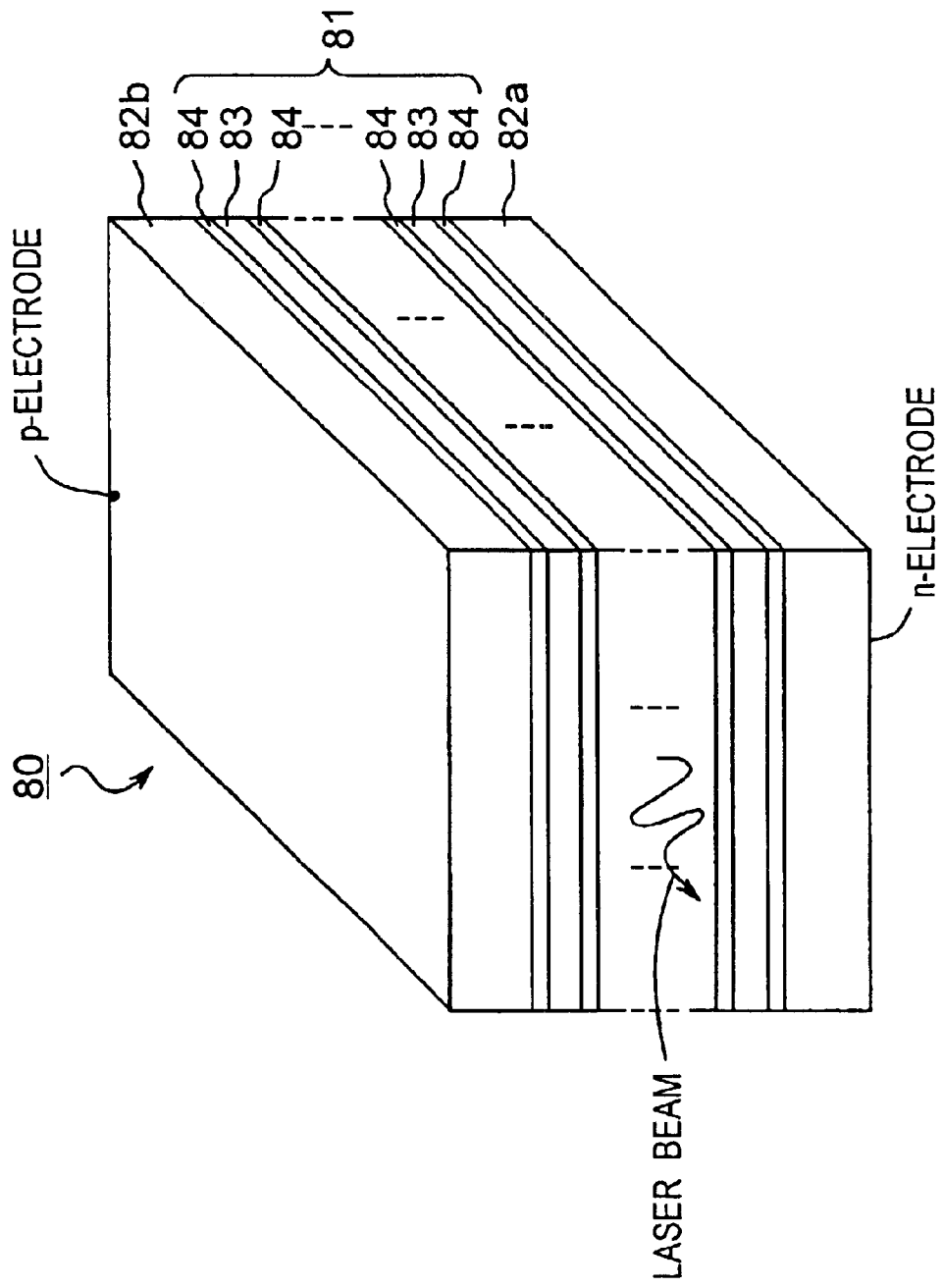
FIG. 8 is a schematic perspective view showing an example of a basic structure of a main portion of a conventional semiconductor laser.

A fifth embodiment of the present invention will be described below with reference to FIG. 7. FIG. 7 shows a model view of an energy band gap of a stepwise graded MQW according to the fifth embodiment. A width of each well layer and a configuration thereof are optimized such that, in the multi quantum well (MQW) structure of the active layer 13, quantum levels contributing to light emission are equal over the entire well layers. Well layers in the vicinity of the cladding layers are made deeper to have smaller energy band gaps.

In the example shown in FIG. 7, an MQW model with five quantum well layers (well layers) is provided. A well layer W0 at a central portion is the widest. A width of the well layers is made narrower in the order of W1 and W2 toward the outside. The closer to the cladding layers 11a and 11b sandwiching the active layer 13 from the outside, the smaller the energy of the quantum well layer is. A thickness of each of the quantum well layers is optimized such that an energy of electrons confined within the active layer 13, i.e., a quantum level is constant over the entire well layers. Thus, in the present embodiment, the quantum well layer with narrower energy band gap has smaller thickness.

In accordance with the present embodiment, the quantum well layers (well layers W2, W1 and W0) of the active layer 13 have smaller energy band gaps and smaller thickness toward the vicinity of the cladding layer. Thus, a quantum level becomes large because of a carrier confinement effect, and a quantum level contributing to light emission is constant over the entire active layer. Thus, overflowing of carriers from the active layer to the cladding layer is suppressed and the temperature characteristic of the semiconductor laser is improved.

The MQW structure of the active layer described in the fifth embodiment in which the width of the well layers and the configuration thereof are optimized may be appropriately combined and applied as the active layer of the above-described first to fourth embodiments.

As described above, in accordance with the present invention, a MQB structure is used for a STEP structure of a cladding layer, and thus overflowing of carriers from the active layer of MQW can be suppressed. Further, cut-off of a guided mode can be prevented, a reflectance of electrons entering the energy barriers can be increased and a temperature characteristic of a semiconductor laser can be improved.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A semiconductor light-emitting device comprising:
   an active layer for generating light, the active layer having a multi quantum well structure including a plurality of barrier layers and a plurality of quantum well layers, alternately arranged; and
   a pair of cladding layers which sandwiches the active layer to confine the light within the active layer, wherein
   each of the cladding layers has a multi quantum barrier structure including a plurality of barrier layers and a plurality of well layers, alternately arranged, and
   the multi quantum barrier layers of each of the cladding layers are graded in energy band gaps.

2. The semiconductor light-emitting device according to claim 1, wherein energy band gaps of the barrier layers in the multi quantum barrier structure vary stepwise.

3. The semiconductor light-emitting device according to claim 1, wherein energy band gaps of the well layers in the multi quantum barrier structure vary stepwise.

4. The semiconductor light-emitting device according to claim 1, wherein the multi quantum barrier structures of the pair of cladding layers sandwiching the active layer are different in energy band gaps and asymmetric in structure.

5. The semiconductor light-emitting device according to claim 1, wherein each cladding layer is partially modulation doped only for the barrier layers, only for the well layers, only for some of the barrier layers, or only for some of the well layers.

6. The semiconductor light-emitting device according to claim 1, wherein in the multi quantum well structure of the active layer, width and configuration of each of the quantum well layers are optimized so that quantum levels contributing to light emission are constant over all the quantum well layers, and energy band gap of a quantum well layer proximate one of the cladding layers is smaller than the energy band gap of a quantum well layer at a central portion of the active layer.

* * * * *